(12) United States Patent
Lee

(10) Patent No.: US 9,042,066 B2
(45) Date of Patent: May 26, 2015

(54) OUTPUT STAGE WITH SHORT-CIRCUIT PROTECTION

(71) Applicant: Himax Analogic, Inc., Tainan (TW)

(72) Inventor: Chow-Peng Lee, Tainan (TW)

(73) Assignee: HIMAX ANALOGIC, INC., Tainan (TW)

( * ) Notice: Subject to any disclaimer, the term of this patent is extended or adjusted under 35 U.S.C. 154(b) by 2 days.

(21) Appl. No.: 14/037,479

(22) Filed: Sep. 26, 2013

(65) Prior Publication Data
US 2015/0085414 A1 Mar. 26, 2015

(51) Int. Cl.
| | |
|---|---|
| *H02H 3/00* | (2006.01) |
| *H02H 3/08* | (2006.01) |
| *H03K 17/0812* | (2006.01) |
| *H03K 17/082* | (2006.01) |
| *H02H 9/02* | (2006.01) |

(52) U.S. Cl.
CPC ........... *H02H 3/08* (2013.01); *H03K 17/08122* (2013.01); *H03K 17/0822* (2013.01); *H02H 9/02* (2013.01)

(58) Field of Classification Search
USPC .................................... 361/86, 87, 93.7–93.9
See application file for complete search history.

(56) References Cited

U.S. PATENT DOCUMENTS

| | | | | |
|---|---|---|---|---|
| 6,385,060 | B1 * | 5/2002 | Basso et al. ................ | 363/21.15 |
| 8,045,210 | B2 * | 10/2011 | Morikawa .................... | 358/1.16 |
| 2001/0010482 | A1 * | 8/2001 | Oki et al. ......................... | 330/10 |
| 2009/0153251 | A1 * | 6/2009 | Cheng et al. .................. | 330/298 |

* cited by examiner

*Primary Examiner* — Danny Nguyen
(74) *Attorney, Agent, or Firm* — McClure, Qualey & Rodack, LLP

(57) ABSTRACT

An output stage with short-circuit protection includes a power transistor, a detecting module, a disable module, and a driving module. The power transistor is electrically connected between a voltage source and an output node. A gate end of the power transistor is configured to receive a driving signal. The detecting module is configured to detect an output voltage on the output node to determine whether a short-circuit condition occurs, and to provide a detecting signal according to the output voltage on the output node in the short-circuit condition. The disable module is configured to provide a disable signal according to the detecting signal in the short-circuit condition, and operatively stop the disable signal in each cycle period of a clock signal. The driving module is configured to determine whether to generate the driving signal according to the disable signal and the clock signal.

19 Claims, 9 Drawing Sheets

OUTPUT STAGE WITH SHORT-CIRCUIT PROTECTION

BACKGROUND

1. Technical Field

The present disclosure relates to an electronic circuit. More particularly, the present invention relates to an output stage with short-circuit protection.

2. Description of Related Art

In information era, digital electronic signals have been widely used in various kinds of electronic devices. For the digital electronic signals in the electronic devices, different logic values such as logic 0 and logic 1 are typically presented by different electrical voltage levels.

The definitions of the logic values may be different in view of different digital circuits. For example, a voltage level greater than 1.3 V may be regarded as logic 1 in a microprocessor of an operating voltage ranging from 0V to 1.5V, and the same voltage level may be regarded as logic 0 in a power circuit of an operating voltage ranging from −20V to 40V. Therefore, a voltage level shifter is indispensable which is applied between two digital circuits to convert an input signal of the original operating voltage to an output signal of the converted operating voltage.

However, since the voltage level shifter is used to process signal in a large range of the operating voltage (e.g., −20V to 40V), if a short-circuit condition occurs, the inrush current may severely damage the voltage level shifter and the digital circuits to which the voltage level shifter is applied. Therefore, an output stage with short-circuit protection is desired.

SUMMARY

One aspect of the present invention is directed to an output stage with short-circuit protection. In accordance with one embodiment of the present invention, the output stage includes a power transistor, a detecting module, a disable module, and a driving module. The power transistor includes a first end, a second end, and a gate end. The first end of the power transistor is electrically connected to a first voltage source with a first reference voltage level. The second end of the power transistor is electrically connected to an output node. The gate end of the power transistor is configured to receive a driving signal. The detecting module is configured to detect an output voltage on the output node to determine whether a short-circuit condition occurs, and to provide a detecting signal according to the output voltage on the output node in the short-circuit condition. The disable module is configured to provide a disable signal according to the detecting signal in the short-circuit condition, and operatively stop the disable signal in each cycle period of a clock signal. The driving module is configured to determine whether to generate the driving signal according to the disable signal and the clock signal.

Another aspect of the present invention is directed to an output stage with short-circuit protection. In accordance with one embodiment of the present invention, the output stage includes a first end, a second end, and a gate end. The first end of the first power transistor is electrically connected to a voltage source with a first reference voltage level. The second end of the first power transistor is electrically connected to an output node. The gate end of the first power transistor is configured to receive a first driving signal. The second power transistor includes a first end, a second end, and a gate end. The first end of the second power transistor is electrically connected to the voltage source with the first reference voltage level. The second end of the second power transistor is electrically connected to the output node. The gate end of the second power transistor is configured to receive a second driving signal. The detecting module is configured to detect an output voltage on the output node to determine whether a short-circuit condition occurs, and to provide a detecting signal in the short-circuit condition. The protecting module is configured to provide the first driving signal to the gate end of the second power transistor to serve as the second driving signal in a normal condition, and to turn off the second power transistor in the short-circuit condition according to the detecting signal.

Thus, through application of one of the embodiments mentioned above, the output stage with short-circuit protection can be implemented. By using such an output stage in a voltage level shifter which used to process signal with a large range of the operating voltage, even if the short-circuit condition occurs, damages of the voltage level shifter and the digital circuits coupled to the voltage level shifter can be avoided.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
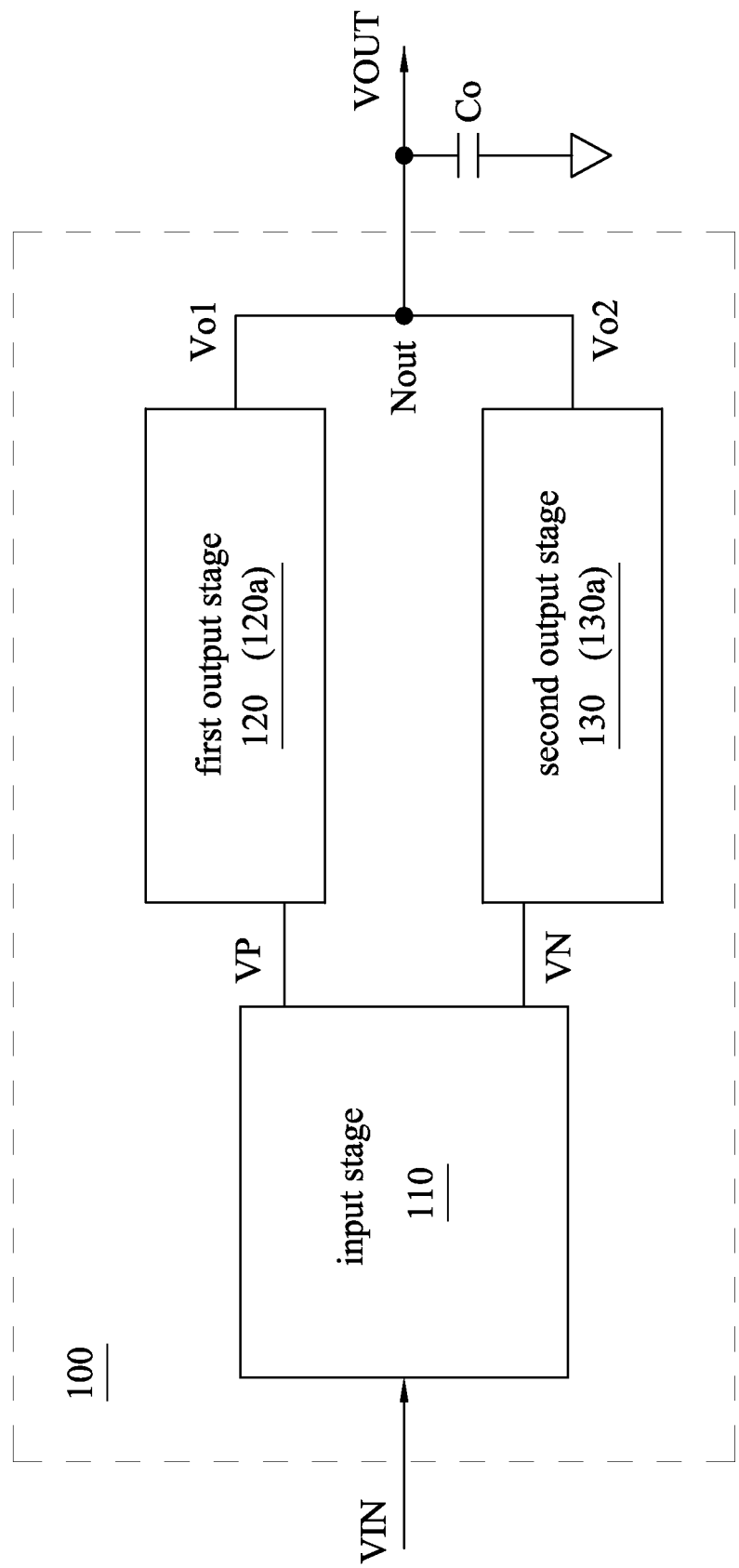
FIG. 1 is a schematic diagram of a voltage level shifter in accordance with one embodiment of the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Moreover, "electrically connect" or "connect" can further refer to the interoperation or interaction between two or more elements.

In addition, any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

Moreover, unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram of a voltage level shifter 100 in accordance with one embodiment of the present disclosure. The voltage level shifter 100 is configured to receive an input signal VIN with a first operating voltage range (e.g., from 0V to 5V), and generate an output signal VOUT with a second operating voltage range (e.g., from −20V to 40V). It should be noted that, in the following description, the operating voltage ranges, in which the first operating voltage range is smaller than the second operating voltage range, would be taken as a descriptive example. However, the present disclosure is not limited to such an aspect.

In this embodiment, the voltage level shifter 100 includes an input stage 110, a first output stage 120 (120a), and a second output stage 130 (130a). The input stage 110 is electrically connected to the first output stage 120 (120a) and the second output stage 130 (130a). Both the first output stage 120 (120a) and the second output stage 130 (130a) are electrically connected to an output node Nout and a loading capacitor Co coupled to the output node Nout. It should be noted that, in this embodiment, all the input stage 110, the first output stage 120 (120a), and the second output stage 130 (130a) can be implemented by electronic circuits.

The input stage 110 is configured to receive the input voltage VIN, and provide a signal VP to the first output stage 120 (120a) or provide a signal VN to the second output stage 130 (130a). The first output stage 120 (120a) is configured to operatively receive the signal VP, and provide a voltage Vo1 to the output node Nout according to the signal VP to serve as the output voltage VOUT. The second output stage 130 (130a) is configured to operatively receive the signal VN, and provide a voltage Vo2 to the output node Nout according to the signal VN to serve as the output voltage VOUT. In one embodiment, in a condition that the input voltage VIN has a first voltage level (e.g., 5V), the first output stage 120 (120a) receives the signal VP and provides the voltage Vo1 (e.g., with a voltage level 40V) to the output node Nout, and in a condition that the input voltage VIN has a second voltage level (e.g., 0V), the second output stage 130 (130a) receives the signal VN and provides the voltage Vo2 (e.g., with a voltage level −20V) to the output node Nout. It should be noted that the embodiment above is just an example, and in practice, the connection between the input stage 110, the first output stage 120 (120a), and the second output stage 130 (130a) in the voltage level shifter 100 can be varied on the basis of actual requirements, with the connection thereof not being limited to the embodiment described above. That is, any connection between the input stage 110, the first output stage 120 (120a), and the second output stage 130 (130a) which can make the first output stage 120 (120a) and the second output stage 130 (130a) perform the following operations can be used in this application.

In the following paragraphs, more details about the first output stage 120 would be provided. However, the present invention is not limited to the details disclosed below.

Figure 2:
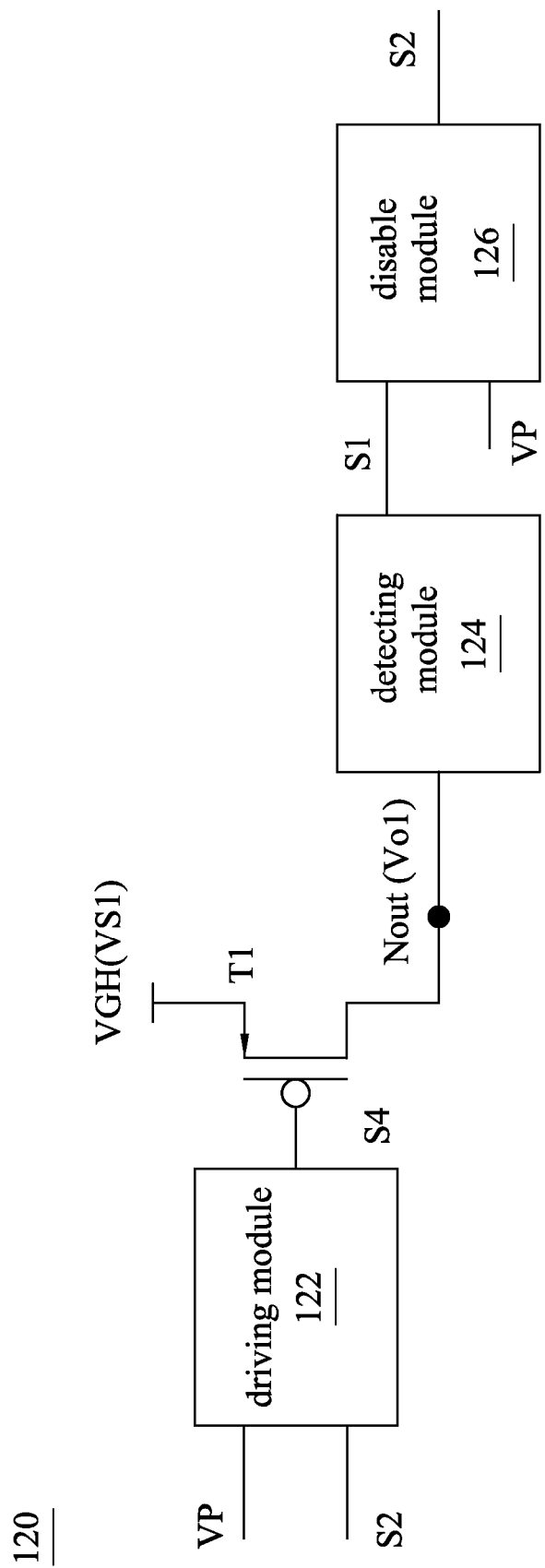
FIG. 2 is a schematic diagram of a first output stage in accordance with one embodiment of the present disclosure.

FIG. 2 is a schematic diagram of the first output stage 120 in accordance with one embodiment of the present disclosure. In the embodiment, the first output stage 120 includes a power transistor T1, a driving module 122, a detecting module 124, and a disable module 126. In this embodiment, the power transistor T1 has a first end, a second end, and a gate end. The first end of the power transistor T1 is electrically connected to a voltage source VS1 with a voltage level VGH. The second end of the power transistor T1 is electrically connected to the output node Nout and the detecting module 124. The gate end of the power transistor T1 is electrically connected to the driving module 122. The detecting module 124 is electrically connected between the output node Nout and the disable module 126. The disable module 126 is electrically connected to the driving module 122. The driving module 122 is electrically connected between the disable module and the gate end of the power transistor T1.

In this embodiment, the power transistor T1 can be implemented by a p-type power metal oxide semiconductor field-effect transistor (MOSFET). All the driving module 122, the detecting module 124, and the disable module 126 can be implemented by electronic circuits.

In this embodiment, the transistor T1 is configured to receive a driving signal S4 generated by the driving module 122, and configured to be turned on according to the driving signal S4 to provide the voltage level VGH to the output node Nout. The detecting module 124 is configured to detect the voltage Vo1 on the output node Nout to determine whether a short-circuit condition occurs, and to provide a detecting signal S1 to the disable module 126 according to the voltage Vo1 on the output node Nout in the short-circuit condition. The disable module 126 is configured to receive the detecting signal S1 and the signal VP (e.g., a clock signal), and to provide a disable signal S2 according to the detecting signal S1 and the signal VP in the short-circuit condition. In addition, the disable module 126 is further configured to operatively stop the disable signal S2 in each cycle period of the signal VP. The driving module 122 is configured to receive the disable signal S2 and the signal VP, to determine whether to generate the driving signal S4 according to the disable signal S2 and the signal VP.

Figure 3:
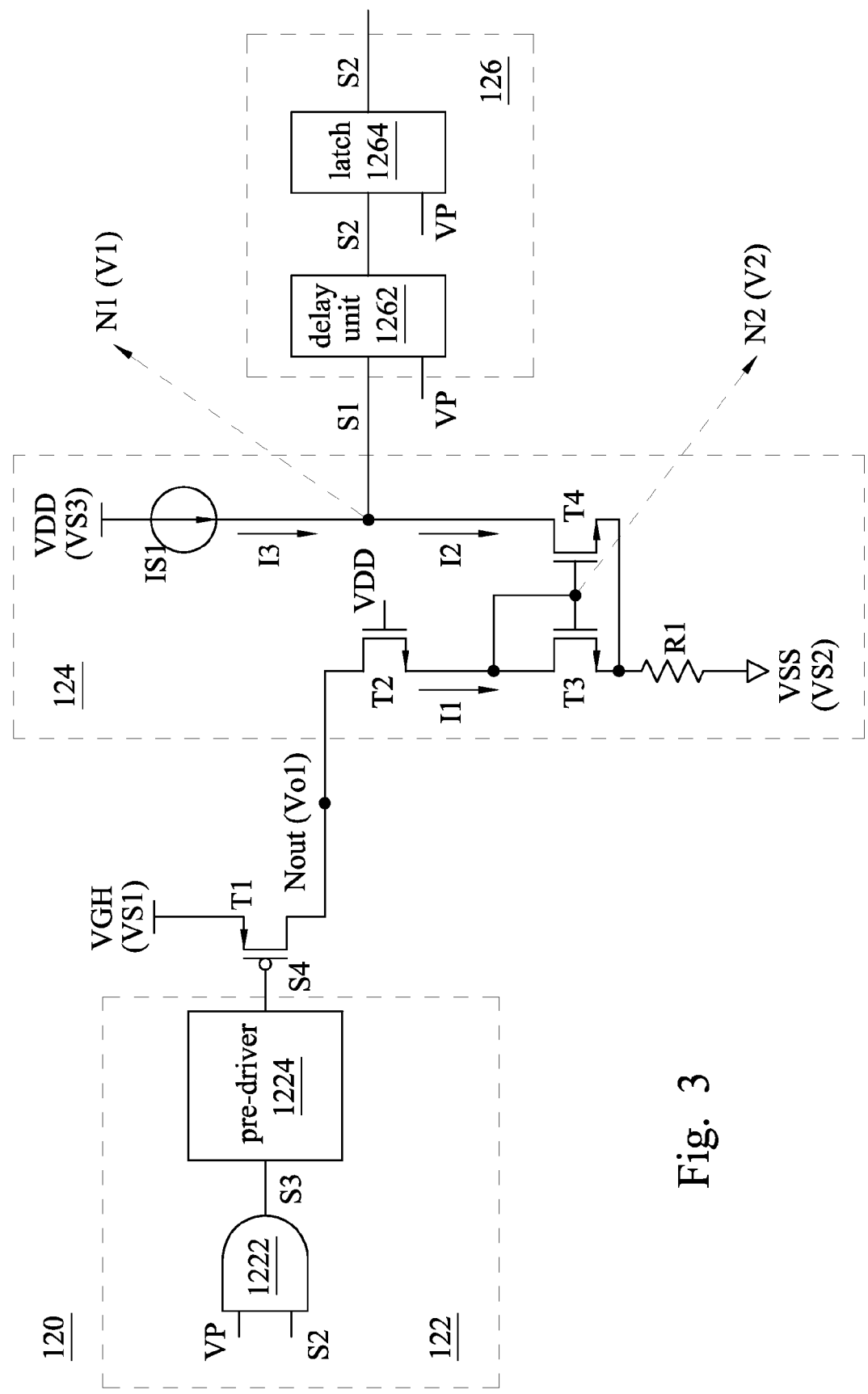
FIG. 3 is a schematic diagram illustrating details of the first output stage in FIG. 2 in accordance with one embodiment of the present disclosure.

For example, in one embodiment, in a case that the voltage level of the voltage Vo1 on the output node Nout is shorted to a low voltage level such as a ground voltage level (e.g., a voltage level VSS (e.g., 0V) as shown in FIG. 3) or a voltage level VGL (e.g., −20V) as shown in FIG. 3), the detecting module 124 determines the short-circuit condition occurs and accordingly outputs the detecting signal S1 according to the low voltage level of the voltage Vo1 on the output node Nout. The disable module 126 outputs the disable signal S2 in a duration when the detecting signal S1 is received (i.e., in the short-circuit condition) and the signal VP has a first voltage level (e.g., a high voltage level), and the disable module 126 stops outputting the disable signal S2 in a duration when the signal VP has a second voltage level (e.g., a low voltage level). The driving voltage module 122 stops outputting the driving signal S4 in a duration when the disable signal S2 is received (i.e., in the short-circuit condition), and restarts to output the driving signal S4 after a time point the disable signal S2 is stopped. The power transistor T1 is deactivated in a duration when the driving signal S4 is not received (i.e., in the short-circuit condition) to disconnect the source VS1 and the output node Nout, and is reactivated in a duration when the driving signal S4 is received (i.e., in the normal condition) to operatively provide the voltage level VGH to the output node Nout.

Through application of one of the embodiments mentioned above, the voltage level shifter 100 with a short-protection function can be implemented. By using such a voltage level shifter to process signal with a large range of the operating voltage, even if the short-circuit condition occurs, damages of the voltage level shifter 100 and the digital circuits coupled to the voltage level shifter 100 can be avoided.

In the following paragraphs, more specific details about the first output stage 120 would be provided. However, the present invention is not limited to the details disclosed below.

FIG. 3 is a schematic diagram illustrating details of the first output stage 120 in FIG. 2 in accordance with one embodiment of the present disclosure. In this embodiment, the detecting module 124 includes a clamp transistor T2, a current mirror including transistors T3, T4, a current source IS1, and a current limiting resistor R1. In this embodiment, the transistors T2-T4 are n-type transistors. The clamp transistor T2 is electrically connected between the output node Nout and the current mirror (e.g., T3, T4). The gate end of the transistor T2 is electrically connected to a voltage source VS3 with a voltage level VDD (e.g., 5V). The first end of the transistor T3 in the current mirror is electrically connected to the clamp transistor T2. The second end of the transistor T3 in the current mirror is electrically connected to the current limiting resistor R1. The gate end of the transistor T3 in the current mirror is electrically connected to the first end of the transistor T3 and the gate end of the transistor T4 in the current mirror. The first end of the transistor T4 in the current mirror is electrically connected to a node N1. The second end of the transistor T4 in the current mirror is electrically connected to the second end of the transistor T3 and the current limiting resistor R1. The current source IS1 is electrically connected between the voltage source VS3 with the voltage level VDD and the node N1. The current limiting resistor R1 is electrically connected between the current mirror (i.e., T3, T4) and a voltage source VS2 with a voltage level VSS (e.g., 0V).

In this embodiment, the current source IS1 is configured to generate (e.g., provide) a comparing current I3 flowing through (e.g., flowing toward) the node N1. The current mirror (i.e., T3, T4) is configured to generate (e.g., sink) a comparing current I2 flowing through (e.g., flowing from) the node N1 according to the voltage Vo1 on the output node Nout. Through designing the quantity of the currents I2, I3, the voltage V1 on the node N1 can be charged to the voltage level VDD in the short-circuit condition that the comparing current I2 is smaller than the comparing current I3, to serve as the detecting signal S1.

For example, in the normal condition, the voltage Vo1 on the output node Nout has the voltage level VGH. According to the voltage level VGH of the voltage Vo1, a current I1 is generated and flows through the clamp transistor T2 (e.g., supposed the clamp transistor is turned on according to the voltage level VDD), the transistor T3, and the current limiting resistor R1. According to the current I1, the current mirror (e.g., T3, T4) sinks the current I2 from the node N1. At this time, the current I3 is generated by the current source IS1 flows to the voltage source VS2 via the transistor T4 and the current limiting resistor R1. Hence, the charges do not be accumulated on the node N1, and the node N1 does not be charged to the voltage level VDD. While in the short-circuit condition, the voltage Vo1 on the output node Nout is shorted to a low voltage level, such as the voltage level VSS (e.g., 0V) or the voltage level VGL (e.g., −20V). Since the voltage Vo1 on the output node Nout is shorted to the low voltage level, the current I1 becomes zero, and the current I2 also becomes zero. At this time, the current I2 is smaller than the current I3, and the charges of the current I3 driven by the current source IS1 are accumulated on the node N1. Hence, the node N1 is charged to the voltage level VDD, such that the detecting signal S1 is provided to the disable module 126.

In such a way, the detecting module 124 can provide the detecting signal S1 to the disable module 126 in the short-circuit condition.

In addition, in this embodiment, the clamp transistor T2 is configured to receive the voltage level VDD, and to clamp a gate voltage on the gate end of the transistor T3 between a clamp voltage level corresponding to the voltage level VDD and the voltage level VSS. For example, if the voltage level VDD is 5V, the voltage level VSS is 0V, and a threshold voltage of the clamp transistor T2 is 0.7V, then the gate voltage on the gate end of the transistor T3 is limited between the voltage level VSS and the clamp voltage level which is equal to 5V−0.7V=4.3V. In such a configuration, the transistors T3, T4 can be manufactured with withstanding voltages between the gate ends and the second ends merely higher than a voltage difference between the clamp voltage level (4.3V) and the voltage level VSS (0V), such that the sizes and the costs of the transistors T3, T4 can be minimized.

In another aspect, the clamp voltage level should be configured to be smaller than or equal to a sum of any one of the withstanding voltages of transistor T3 and the transistor T4 and the voltage level VSS.

Moreover, in this embodiment, the current limiting resistor R1 is configured to decrease the quantities of the currents I1, I2 flowing through the current mirror (e.g., T3, T4) in the normal condition, so as to decrease a power consumption of the current mirror in the normal condition.

It should be noted that, in some embodiment of the present invention, the clamp transistor T2 and the current limiting resistor R1 can be dismissed. Thus, the application is not limited to the embodiment above. In addition, all the values of the voltage levels describe above are merely descriptive examples, in practice, all the values of the voltage levels can be varied on the basis of actual requirement, with the values thereof not being limited to the embodiment described above. Moreover, the voltage levels (e.g., VGH, VGL, VDD, VSS) describe above are merely used to facilitate the description to follow by the reader, all the voltage levels can be varied on the basis of actual requirement, with the voltage levels thereof not being limited to the embodiment described above.

In this embodiment, the disable module 126 includes a delay unit 1262 and a latch 1264. The delay unit 1262 is electrically connected between the node N1 and the latch 1264. The latch 1264 is electrically connected between the delay unit 1262 and the driving module 122.

Figure 8A:
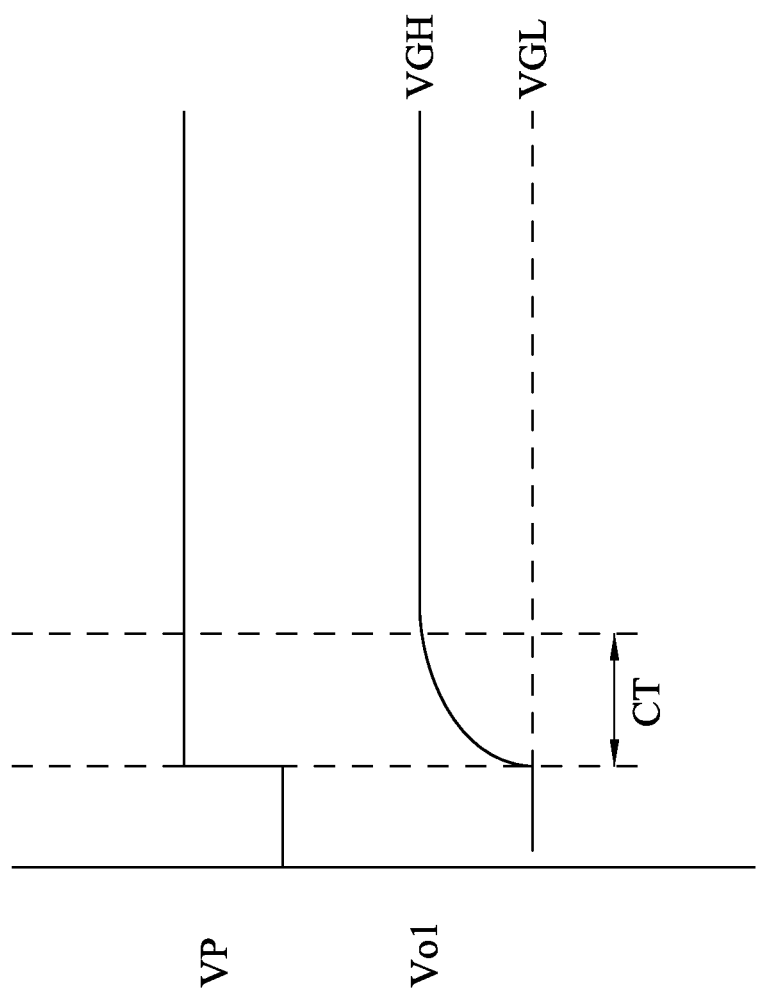
FIG. 8*a* is a diagram illustrating a charging time of a capacitor coupled to an output node in a start condition in accordance with one embodiment of the present disclosure.

The delay unit 1262 is configured to receive the signal VP and the detecting signal S1, to operatively delay the detecting signal S1 with a delay time period to generate the disable signal S2 in the short-circuit condition. In this embodiment, the delay time period is longer than or equal to a charging time of the loading capacitor Co electrically connected to the output node Nout, so as to avoid a start condition of the first output stage 120 being judged as the short-circuit condition. To better explain such a delay time period, reference is also made to FIG. 8a. In the start condition of the first output stage 120, the voltage level of the voltage Vo1 on the output node Nout is, for example, pulled up from the voltage level VGL to the voltage level VGH with a charging time CT. If the delay time period which the disable signal S2 lags behind the detecting signal S1 is shorter than the charging time CT, then in the start condition, the disable signal S2 would be incorrectly outputted. Hence, in design, the delay time period longer than or equal to the charging time CT of the loading capacitor Co is needed.

In one embodiment, the delay unit 1262 is an R-C delay unit. Through adjusting resistor(s) and capacitor(s) inside the R-C delay unit, the delay time period which the disable signal S2 lags behind the detecting signal S1 can be adjusted.

In addition, the delay unit 1262 is configured to output the disable signal S2 in a case that the signal VP has a high voltage level and the detecting signal S1 is received (e.g., in this period, the capacitor(s) inside the delay unit 1262 is charged), and stop outputting the disable signal S2 in a case that the signal VP has a low voltage level (e.g., in this period, the capacitor(s) inside the delay unit 1262 is discharged).

The latch 1264 is configured to receive the disable signal S2 and the signal VP to keep the disable signal S2 to be provided to the driving module 122, and to operatively clear the kept disable signal S2 in each cycle period of the signal VP. For example, in a duration the signal VP has a high voltage level and the disable signal S2 is received, the disable signal S2 is kept to be provided to the driving module 122, while in a duration the signal VP has a low voltage level, the kept disable signal S2 is cleared.

Moreover, in one embodiment, the driving module 122 includes a logic unit (e.g., an AND gate) 1222 and a pre-driver 1224. The logic unit 1222 is electrically connected between the disable module 126 and the pre-driver 1224. The pre-driver 1224 is electrically connected between the logic unit 1222 and the power transistor T1.

In this embodiment, the logic unit 1222 is configured to receive the signal VP and the disable signal S2, and to provide a control signal S3 according to the signal VP and the disable signal S2. The pre-driver 1224 is configured to receive the control signal S3 and provide the driving signal S4 to the power transistor T1 according to the control signal S3 to operatively turn on and off the power transistor T1.

For example, in one embodiment, in a case that the logic unit 1222 receives the disable signal S2 (e.g., the disable signal S2 has a low voltage level), the logic unit 1222 does not output the control signal S3 (e.g., the control signal S3 has a low voltage level), and the pre-driver 1224 does not provide the driving signal S4 to the power transistor T1 (e.g., the driving signal S4 has a high voltage level), such that the power transistor T1 is turned off. On the other hand, in a case that the logic unit 1222 does not receive the disable signal S2 (e.g., the disable signal S2 has a high voltage level) and the signal VP has a high voltage level, the logic unit 1222 outputs the control signal S3 (e.g., the control signal S3 has a high voltage level), and the pre-driver 1224 provides the driving signal S4 to the power transistor T1 (e.g., the driving signal S4 has a low voltage level) according to the control signal S3, such that the power transistor T1 is turned on.

Through application of one of the embodiments mentioned above, when the short-circuit condition occurs, the power transistor T1 would be turned off, such that damages of the voltage level shifter 100 (e.g., the power transistor T1) and the digital circuits coupled to the voltage level shifter 100 caused by the inrush current can be avoided. After the short-circuit condition ends up, the first output stage 120 is recovered to the normal condition when the signal VP has a low voltage level. In this regards, the voltage level shifter 100 with a short-protection function can be implemented.

In the following paragraph more specific details about the second output stage 130 would be provided. However, the present invention is not limited to the details disclosed below. In addition, the configuration and operations of the second output stage 130 are quiet similar to the first output stage 120, and therefore, a description of many aspects that are similar will not be repeated.

Figure 4:
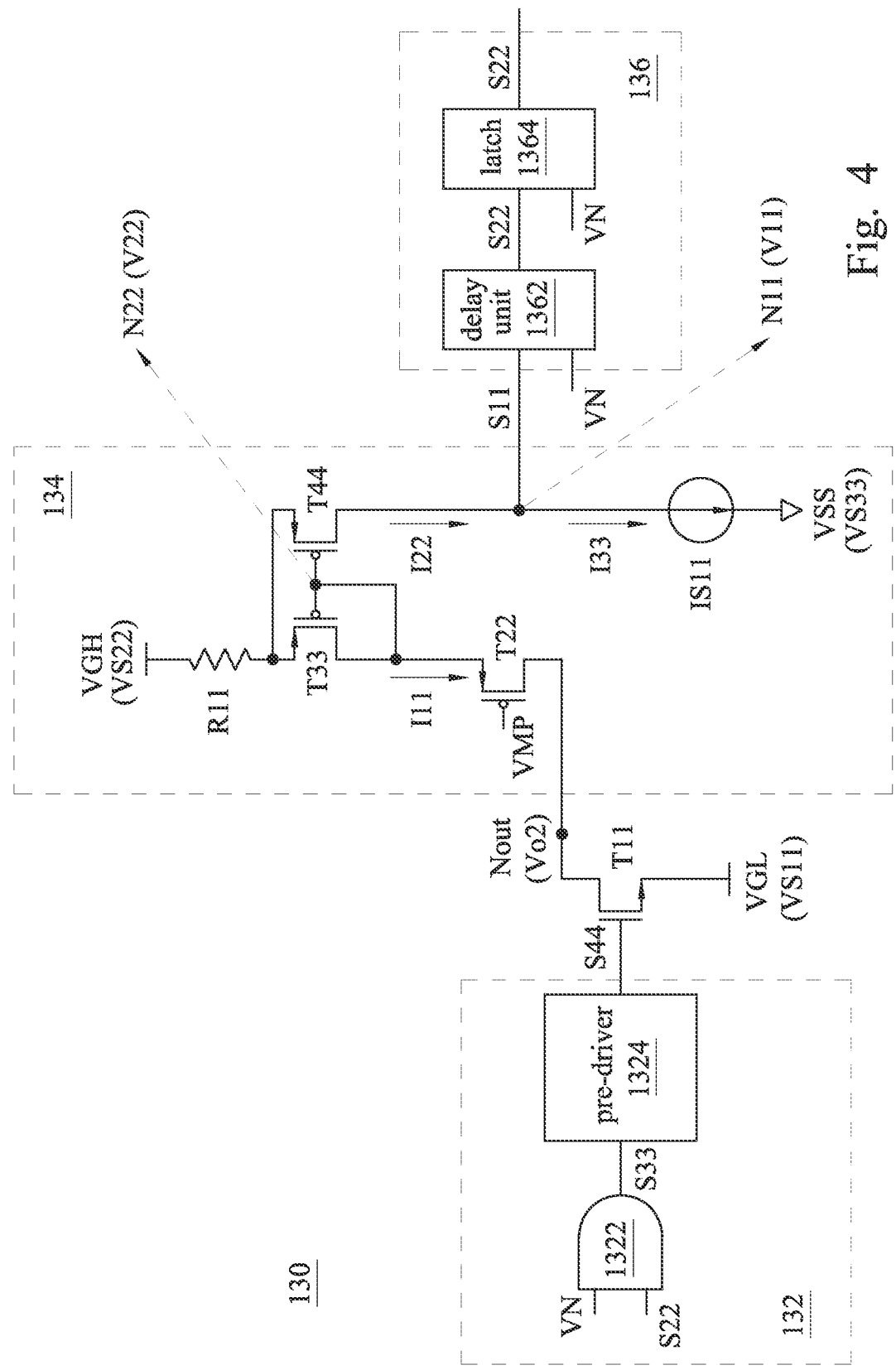
FIG. 4 is a schematic diagram of a second output stage in accordance with one embodiment of the present disclosure.

FIG. 4 is a schematic diagram of the second output stage 130 in accordance with one embodiment of the present disclosure. In this embodiment, the second output stage 130 includes a power transistor T11, a driving module 132, a detecting module 134, and a disable module 136. The power transistor T11 can be electrically connected between a voltage source VS11 with a voltage level VGL and the output node Nout. The connection between the power transistor T11, driving module 132, and disable module 136 can be ascertained by referring to the above paragraphs, and a description in these regard will not be repeated herein.

In this embodiment, the power transistor T11 can be implemented by an n-type power MOSFET. All the driving module 132, the detecting module 134, and the disable module 136 can be implemented by electronic circuits.

In this embodiment, the transistor T11 is configured to receive a driving signal S44 generated by the driving module 132, and configured to be turned on according to the driving signal S44 to provide the voltage level VGL to the output node Nout. The detecting module 134 is configured to detect the voltage Vo2 on the output node Nout to determine whether a short-circuit condition occurs, and to provide a detecting signal S11 to the disable module 136 according to the voltage Vo2 on the output node Nout in the short-circuit condition. The disable module 136 is configured to receive the detecting signal S11 and the signal VN (e.g., a clock signal), and to provide a disable signal S22 according to the detecting signal S11 and the signal VN in the short-circuit condition. In addition, the disable module 136 is further configured to operatively stop the disable signal S22 in each cycle period of the signal VN. The driving module 132 is configured to receive the disable signal S22 and the signal VN, to determine whether to generate the driving signal S44 according to the disable signal 136 and the signal VN.

For example, in one embodiment, in a case that the voltage level of the voltage Vo2 on the output node Nout is shorted to a high voltage level such as a voltage level VGH (e.g., 40V), the detecting module 134 determines the short-circuit condition occurs and accordingly outputs the detecting signal S11 according to the high voltage level of the voltage Vo2 on the output node Nout. The disable module 136 outputs the disable signal S22 in a duration when the detecting signal S11 is received (i.e., in the short-circuit condition) and the signal VN has a first voltage level (e.g., a high voltage level), and the disable module 136 stops outputting the disable signal S22 in a duration when the signal VN has a second voltage level (e.g., a low voltage level). The driving voltage module 132 stops outputting the driving signal S44 in a duration when the disable signal S22 is received (i.e., in the short-circuit condition), and restarts to output the driving signal S44 after a time point the disable signal S22 is stopped. The power transistor T11 is deactivated in a duration when the driving signal S44 is not received (i.e., in the short-circuit condition) to disconnect the source VS11 and the output node Nout, and is reactivated in a duration when the driving signal S44 is received (i.e., in the normal condition) to operatively provide the voltage level VGL to the output node Nout.

Through application of one of the embodiments mentioned above, the voltage level shifter 100 with a short-protection function can be implemented. By using such a voltage level shifter to process signal with a large range of the operating voltage, even if the short-circuit condition occurs, damages of the voltage level shifter 100 and the digital circuits coupled to the voltage level shifter 100 can be avoided.

In the following paragraphs, more specific details about the second output stage 130 would be provided. However, the present invention is not limited to the details disclosed below.

In one embodiment, the detecting module 134 includes a clamp transistor T22, a current mirror including transistors T33, T44, a current source IS11, and a current limiting resistor R11. In this embodiment, the transistors T22-T44 are p-type transistors. The clamp transistor T22 is electrically connected between the output node Nout and the current mirror (e.g., T33, T44). The gate end of the transistor T22 is electrically connected to a voltage source with a voltage level VMP (e.g., 35V). The first end of the transistor T33 in the current mirror is electrically connected to the clamp transistor T22. The second end of the transistor T33 in the current mirror is electrically connected to current limiting resistor R11. The gate end of the transistor T33 in the current mirror is electrically connected to the first end of the transistor T33 and the gate end of the transistor T44 in the current mirror. The first end of the transistor T44 in the current mirror is electrically connected to a node N11. The second end of the transistor T44 in the current mirror is electrically connected to the second end of the transistor T33 and the current limiting resistor R11. The current source IS11 is electrically connected between the voltage source VS33 with a voltage level VSS and the node N11. The current limiting resistor R11 is electrically connected between the current mirror (i.e., T33, T44) and a voltage source VS22 with the voltage level VGH (e.g., 40V).

In this embodiment, the current source IS11 is configured to generate (e.g., sink) a comparing current I33 flowing through (e.g., flowing from) the node N11. The current mirror (i.e., T33, T44) is configured to generate (e.g., provide) a comparing current I22 flowing through (e.g., flowing toward) the node N11 according to the voltage Vo2 on the output node Nout. Through designing the quantity of the currents I22, I33, the voltage V11 on the node N11 can be discharged to the voltage level VSS in the short-circuit condition that the comparing current I22 is smaller than the comparing current I33, to serve as the detecting signal S11.

For example, in the normal condition, the voltage Vo2 on the output node Nout has the voltage level VGL. According to the voltage level VGL of the voltage Vo2, a current I11 is generated and flows through the clamp transistor T22 (e.g., supposed the clamp transistor is turned on according to the voltage level VMP), the transistor T33, and the current limiting resistor R11. According to the current I11, the current mirror (e.g., T33, T44) provides the current I22 toward the node N11. At this time, the voltage V11 on the node N11 is charged by the current I22 to a high voltage level (e.g., VGH). While in the short-circuit condition, the voltage Vo2 on the output node Nout is shorted to the high voltage level, such as the voltage level VGH (e.g., 40V). Since the voltage Vo2 on the output node Nout is shorted to the high voltage level, the current I11 becomes zero, and the current I22 also becomes zero. At this time, the current I22 is smaller than the current I33, and the charges on the node N11 are sunk by the current source IS11. Hence, the node N11 is discharged to the voltage level VSS, such that the detecting signal S11 is provided to the disable module 136.

In such a way, the detecting module 134 can provide the detecting signal S11 to the disable module 136 in the short-circuit condition.

In addition, in this embodiment, the clamp transistor T22 is configured to receive the voltage level VMP, and to clamp a gate voltage on the gate end of the transistor T33 between a clamp voltage level corresponding to the voltage level VMP and the voltage level VGH. For example, if the voltage level VMP is 35V, the voltage level VGH is 40V, and a threshold voltage of the clamp transistor T22 is 0.7V, then the gate voltage on the gate end of the transistor T33 is limited between the voltage level VGH and the clamp voltage level which is equal to 35V+0.7V=35.7V. In such a configuration, the transistors T33, T44 can be manufactured with withstanding voltages between the gate ends and the second ends merely higher than a difference between the clamp voltage level (35.7V) and the voltage level VGH (40V), such that the size and the cost of the transistors T33, T44 can be minimized.

In another aspect, the clamp voltage level should be configured to be larger than or equal to a voltage difference by subtracting any one of the withstanding voltages of transistor T33 and the transistor T44 from the voltage level VGH.

Moreover, in this embodiment, the current limiting resistor R11 is configured to decrease the quantities of the currents I11, I22 flowing through the current mirror (e.g., T33, T44) in the normal condition, so as to decrease a power consumption of the current mirror in the normal condition.

It should be noted that, in some embodiment of the present invention, the clamp transistor T22 and the current limiting resistor R11 can be dismissed. Thus, the application is not limited to the embodiment above. In addition, all the values of the voltage levels describe above are merely descriptive examples, in practice, all the values of the voltage levels can be varied on the basis of actual requirement, with the values thereof not being limited to the embodiment described above. Moreover, the voltage levels (e.g., VGH, VGL, VMP, VSS) describe above are merely used to facilitate the description to follow by the reader, all the voltage levels can be varied on the basis of actual requirement, with the voltage levels thereof not being limited to the embodiment described above.

In this embodiment, the disable module 136 includes a delay unit 1362 and a latch 1364. The delay unit 1362 is electrically connected between the node N11 and the latch 1364. The latch 1364 is electrically connected between the delay unit 1362 and the driving module 132.

Figure 8B:
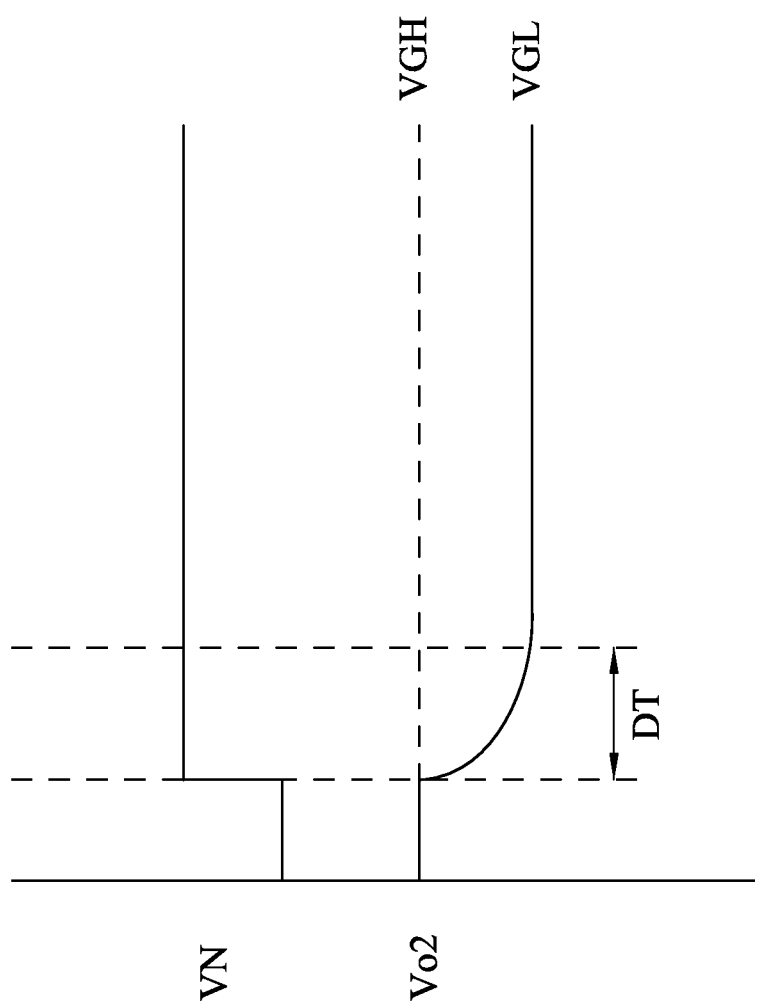
FIG. 8*b* is a diagram illustrating a discharging time of a capacitor coupled to the output node in the start condition in accordance with one embodiment of the present disclosure.

The delay unit 1362 is configured to receive the signal VN and the detecting signal S11, to operatively delay the detecting signal S11 with a delay time period to generate the disable signal S22 in the short-circuit condition. In this embodiment, the delay time period is longer than or equal to a discharging time of the loading capacitor Co electrically connected to the output node Nout, so as to avoid a start condition of the second output stage 130 being judged as the short-circuit condition. To better explain such a delay time period, reference is also made to FIG. 8b. In the start condition of the second output stage 130, the voltage level of the voltage Vo2 on the output node Nout is, for example, pulled down from the voltage level VGH to the voltage level VGL with a discharging time DT. If the delay time period which the disable signal S22 lags behind the detecting signal S11 is shorter than the discharging time DT, then in the start condition, the disable signal S22 would be incorrectly outputted. Hence, in design, the delay time period longer than or equal to the discharging time DT of the loading capacitor Co is needed.

In one embodiment, the delay unit 1362 is an R-C delay unit. Through adjusting resistor(s) and capacitor(s) inside the R-C delay unit, the delay time period which the disable signal S22 lags behind the detecting signal S11 can be adjusted.

In addition, the delay unit 1362 is configured to output the disable signal S22 in a case that the signal VN has a high voltage level and the detecting signal S11 is received, and stop outputting the disable signal S22 in a case that the signal VN has a low voltage level.

The latch 1364 is configured to receive the disable signal S22 and the signal VN to keep the disable signal S22 to be provided to the driving module 132, and to operatively clear the kept disable signal S22 in each cycle period of the signal VN. For example, in a duration the signal VN has a high voltage level and the disable signal S22 is received, the disable signal S22 is kept to be provided to the driving module 132, while in a duration the signal VN has a low voltage level, the kept disable signal S22 is cleared.

Moreover, in one embodiment, the driving module 132 includes a logic unit (e.g., an AND gate) 1322 and a pre-driver 1324. The logic unit 1322 is electrically connected between the disable module 136 and the pre-driver 1324. The pre-driver 1324 is electrically connected between the logic unit 1322 and the power transistor T11.

In this embodiment, the logic unit 1322 is configured to receive the signal VN and the disable signal S22, and to provide a control signal S33 according to the signal VN and the disable signal S22. The pre-driver 1324 is configured to receive the control signal S33 and provide the driving signal S44 to the power transistor T11 according to the control signal S33 to operatively turn on and off the power transistor T11.

For example, in one embodiment, in a case that the logic unit 1322 receives the disable signal S22 (e.g., the disable signal S22 has a low voltage level), the logic unit 1322 does not output the control signal S33 (e.g., the control signal S33 has a low voltage level), and the pre-driver 1224 does not provide the driving signal S44 to the power transistor T11 (e.g., the driving signal S44 has a low voltage level), such that the power transistor T11 is turned off. On the other hand, in a case that the logic unit 1322 does not receive the disable signal S22 (e.g., the disable signal S22 has a high voltage level) and the signal VN has a high voltage level, the logic unit 1322 outputs the control signal S33 (e.g., the control signal S33 has a high voltage level), and the pre-driver 1324 provides the driving signal S44 to the power transistor T11 (e.g., the driving signal S44 has a high voltage level) according to the control signal S33, such that the power transistor T11 is turned on.

Through application of one of the embodiments mentioned above, when the short-circuit condition occurs, the power transistor T11 would be turned off, such that damages of the voltage level shifter 100 (e.g., the power transistor T11) and the digital circuits coupled to the voltage level shifter 100 caused by the inrush current can be avoided. After the short-circuit condition ends up, the second output stage 130 is recovered to the normal condition when the signal VN has a low voltage level. In this regards, the voltage level shifter 100 with a short-protection function can be implemented.

In the following paragraphs, other aspects of the present disclosure are provide as another type of first output stage 120a and another type of second output stage 130a in the voltage level shifter 100. However, the present invention is not limited to the aspect disclosed below.

Figure 5:
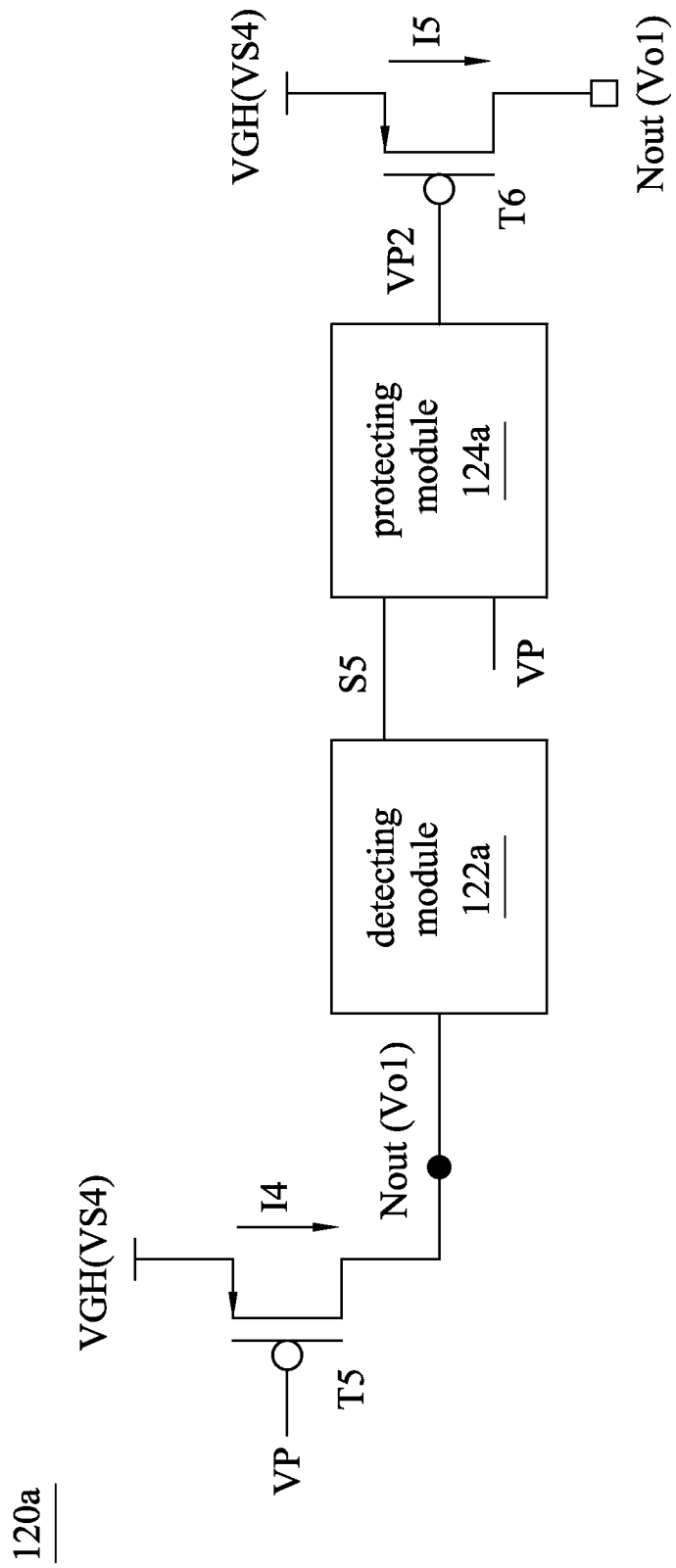
FIG. 5 is a schematic diagram of another type of first output stage in accordance with one embodiment of the present disclosure.

FIG. 5 is a schematic diagram of the first output stage 120a in accordance with one embodiment of the present disclosure. In this embodiment the first output stage 120a includes a power transistor T5, a power transistor T6, a detecting module 122a, and a protecting module 124a. In this embodiment, each the power transistors T5, T6 has a first end, a second end, and a gate end. The first end of the power transistor T5 is electrically connected to a voltage source VS4 with a voltage level VGH (e.g., 40V). The second end of the power transistor T5 is electrically connected to the output node Nout. The gate end of the power transistor T5 is configured to receive the signal VP. The first end of the power transistor T6 is electrically connected to the voltage source VS4 with the voltage level VGH. The second end of the power transistor T6 is electrically connected to the output node Nout. The gate end of the power transistor T6 is configured to receive a signal VP2. The detecting module 122a is electrically connected between the output node Nout and the protecting module 124a. The protecting module 124a is electrically connected between the detecting module 122a and the gate end of the power transistor T6.

In this embodiment, the power transistors T5, T6 can be implemented by p-type power MOSFETs. Both the detecting module 122a and the protecting module 124a can be implemented by electronic circuits.

In this embodiment, the power transistor T5 is configured to be turned on according to the signal VP to provide a current I4 to the output node Nout. The power transistor T6 is configured to be turned on according to the signal VP2 to provide a current I5 to the output node Nout. The detecting module 122a is configured to detect the output voltage Vo1 on the output node Nout to determine whether a short-circuit condition occurs, and to provide a detecting signal S5 in the short-circuit condition. The protecting module 124a is configured to receive the detecting signal S5 and the signal VP, to provide the signal VP to the gate end of the power transistor T6 to serve as the signal VP2 in a normal condition, and to turn off the power transistor T6 according to the detecting signal S5 in the short-circuit condition.

In such a configuration, the voltage level shifter 100 with a short-protection function can be implemented. By operatively deactivated the power transistor T6, the current (e.g., current I4) generated by the first output stage 120a in the short-circuit condition can be decreased from the current (e.g., current I4+current I5) generated by the first output stage 120a in the normal condition, so as to prevent damages of the voltage level shifter 100 and the digital circuits coupled to the voltage level shifter 100.

In the following paragraphs, more specific details about the first output stage 120a would be provided. However, the present invention is not limited to the details disclosed below.

Figure 6:
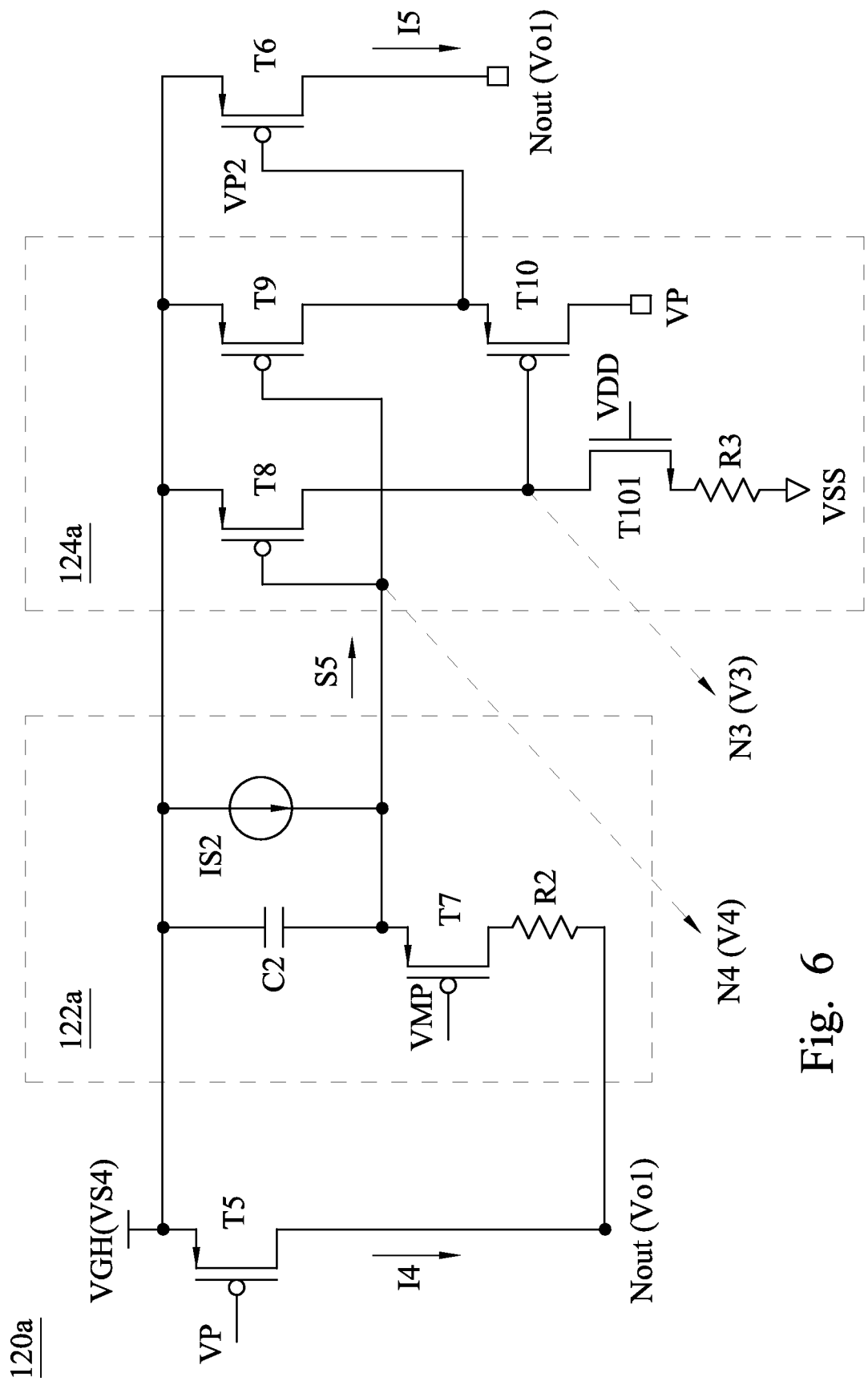
FIG. 6 is a schematic diagram illustrating details of the first output stage in FIG. 5 in accordance with one embodiment of the present disclosure.

FIG. 6 is a schematic diagram illustrating details of the first output stage 120a in FIG. 5 in accordance with one embodiment of the present disclosure. In this embodiment, the detecting module 122a includes a delay capacitor C2, a clamp transistor T7 (e.g., a p-type transistor), a current source IS2, and a current limiting resistor R2. The first end of the clamp transistor T7 is electrically connected to a node N4. The second end of the clamp transistor T7 is electrically connected to the output node Nout through the current limiting resistor R2. The gate end of the clamp transistor T7 is configured to receive a voltage level VMP (e.g., 35V). The current limiting resistor R2 is electrically connected between the second end of the clamp transistor T7 and the output node Nout. The delay capacitor C2 is electrically connected between the voltage source VS4 and the node N4. The current source IS2 is electrically connected between the voltage source VS4 and the node N4.

In this embodiment, a voltage V4 on the node N4 is charged/discharged through the clamp transistor T7 and the current source IS2, to operatively provide the detecting signal S5 to the protection module 124a.

For example, in the normal condition, the voltage Vo1 on the output node Nout has the voltage level VGH. According to the voltage level VGH on the output node Nout, there is no current flowing through the clamp transistor T7. In this period, the delay capacitor C2 is charged by the current source IS2, such that the voltage V4 on the node N4 is charged to the voltage level VGH, and hence, the detecting signal S5 does not be outputted. While in the short-circuit condition, the voltage Vo1 on the output node Nout is shorted to a low voltage level, such as a voltage level VSS (e.g., 0V) or a voltage level VGL (e.g., −20V). According to the low voltage level on the output node Nout, the voltage V4 on the node N4 is discharged to a clamp voltage level corresponding to the voltage level VMP by a current flowing through the clamp transistor T7 (supposed that the clamp transistor T7 is turned on according to the voltage level VMP). At this time, the clamp voltage level on the node N4 is served as the detecting signal S5.

In such a way, the detecting module 122a can provide the detecting signal S5 to the protection module 124a in the short-circuit condition.

It should be noted that, the clamp voltage level can be a voltage level around the voltage level VGH. For example, if the voltage level VMP provided to the clamp transistor T7 is 35V, and the threshold voltage of the clamp transistor T7 is 0.7V, then the clamp voltage level is 35V+0.7V=35.7V. In such a configuration, the transistors coupled to the node N4 (e.g., T8, T9) can be manufactured with withstanding voltages between the gate ends and the first ends (e.g., the source ends) merely higher than a difference between the clamp voltage level (35.7V) and the voltage level VGH (40V), such that the size and the cost of the transistors coupled to the node N4 (e.g., T8, T9) can be minimized.

In another aspect, the clamp voltage level should be configured to be larger than or equal to a voltage difference by subtracting any one of the withstanding voltages of the transistor T8 and the transistor T9 from the voltage level VGH.

In addition, in this embodiment, the current limiting resistor R2 is configured to minimize the quantity of the current flowing through the clamp transistor T7 in the short-circuit condition, so as to decrease a power consumption of the detecting module 120a (e.g., the clamp transistor T7) in the short-circuit condition. It should be noted that, in some embodiment of the present invention, the current limiting resistor R2 can be dismissed.

Moreover, the delay capacitor C2 is configured to delay a time point that the node N4 is discharged to the clamp voltage level with a delay time period. That is, there is the delay time period between a time point when the short-circuit condition occurs and the time point when the node N4 being discharged to the clamp voltage level caused by the delay capacitor C2. Such a delay time period is longer than or equal to a charging time of the loading capacitor Co electrically connected to the output node Nout, so as to avoid a start condition of the first output stage 120a being judged as the short-circuit condition. The details of the start condition of the first output stage 120a and the delay time period can be referred to the paragraphs above (e.g., corresponding to the FIG. 8a), a description in this regard will not be repeated herein.

In this embodiment, the protection module 124a includes a first charge/discharge unit including transistors T8, T101; a second charge/discharge unit including transistors T9, T10; and a current limiting resistor R3. In this embodiment, the transistors T8-T10 are p-type transistors, and the transistor T101 is an n-type transistor. The first end of the transistor T8 is electrically connected to the voltage source VS4. The second end of the transistor T8 is electrically connected to a node N3. The gate end of the transistor T8 is electrically connected to the node N4. The transistor T101 is electrically connected between the node N3 and a voltage source with a voltage level VSS (e.g., 0V) through the current limiting resistor R3. The transistor T101 is configured to receive a voltage level VDD (e.g., 5V), and be turned on according to the voltage level VDD. The current limiting resistor R3 is electrically connected between the transistor T101 and the voltage source with the voltage level VSS. The first end of the transistor T9 is electrically connected to the voltage source VS4. The second end of the transistor T9 is electrically connected to the gate end of the power transistor T6. The gate end of the transistor T9 is electrically connected to the node N4. The first end of the transistor T10 is electrically connected to the gate end of the power transistor T6. The second end of the transistor T10 is electrically connected to the gate end of the power transistor T5. The gate end of the transistor T10 is electrically connected to the node N3.

In this embodiment, the first charge/discharge unit (i.e., T8, T101) is configured to charge the node N3 to the voltage level VGH according to the detecting signal S5 (i.e., the clamp voltage level on the node N4) in the short-circuit condition, and to discharge the node N3 to the voltage level VSS according to the voltage level VGH on the node N4 in the normal condition. The second charge/discharge unit (i.e., T9, T10) is configured to charge the gate end of the power transistor T6 to the voltage level VGH according to the clamp voltage level on the node N4 and the voltage level VGH on the node N3 in the short-circuit condition, and to discharge the gate end of power transistor T6 to a driving voltage level of the signal VP according to the voltage level VGH on the node N4 and the voltage level VSS on the node N3 in the normal condition.

For example, in the normal condition that the voltage V4 on the node N4 has the voltage level VGH, the transistor T8 is turned off according to the voltage level VGH on the node N4, such that the node N3 is discharged to the voltage level VSS. At this time, the transistor T9 is turned off according to the voltage level VGH on the node N4, and the transistor T10 is turned on according to the voltage level VSS on the node N3, such that the signal VP is provided to the gate end of the power transistor T6 to be served as the signal VP2. While in the short-circuit condition that the voltage V4 on the node N4 has the clamp voltage level, the transistor T8 is turned on according to the clamp voltage level on the node N4, to charge the node N3 to the voltage level VGH. At this time, the transistor T10 is turned off according to the voltage level VGH on the node N3, and the transistor T9 is turned on according to the clamp voltage level on the node N4, such that the voltage level VGH is provided to the gate end of the power transistor T6, so as to turn off the power transistor T6.

In another aspect of view, the first charge/discharge unit (i.e., T8, T101) can be a first current comparator, configured to charge and discharge the node N3 according to a current flowing through the transistor T8 and a current flowing through the transistor T101. The second charge/discharge unit (i.e., T9, T10) can be a second current comparator, configured to charge and discharge the gate end of the transistor T6 according to a current flowing through the transistor T9 and a current flowing through the transistor T10.

For example, in the normal condition that the voltage V4 on the node N4 has the voltage level VGH, the transistor T8 is turned off according to the voltage level VGH on the node N4, the current flowing through the transistor T8, which is zero, is smaller than the current flowing through the transistor T101, such that the charges on the node N3 are released, and the node N3 is discharged to the voltage level VSS by the current flowing through the transistor T101. At this time, the transistor T9 is turned off according to the voltage level VGH on the node N4, and the transistor T10 is turned on according to the voltage level VSS on the node N3, the current flowing through the transistor T9, which is zero, is smaller than the current flowing through the transistor T10, such that the charges on the gate end of the transistor T6 are released, and the gate end of the transistor T6 is discharged to the driving voltage level of the signal VP by the current flowing through the transistor T10 to provide the signal VP to the gate end of the transistor T6. While in the short-circuit condition that the voltage V4 on the node N4 has the clamp voltage level, the transistor T8 is turned on according to the clamp voltage level on the node N4, the current flowing through the transistor T8 is greater than the current flowing through the transistor T101, such that the charges are accumulated on the node N3, and the node N3 is accordingly charged to the voltage level VGH by the current flowing through the transistor T8. At this time, the transistor T10 is turned off according to the voltage level VGH on the node N3, and the transistor T9 is turned on according to the clamp voltage level on the node N4, the current flowing through the transistor T9 is greater than the current flowing through the transistor T10, which is zero, such that the charges are accumulated on the gate end of the power transistor T6, and the gate end of the power transistor T6 is accordingly charged to the voltage level VGH by the current flowing through the transistor T9. At this time, the power transistor T6 is turned off.

In such a configuration, the current (e.g., current I4) generated by the first output stage 120a in the short-circuit condition can be decreased from the current (e.g., current I4+current I5) generated by the first output stage 120a in the normal condition, so as to prevent damages of the voltage level shifter 100 and the digital circuits coupled to the voltage level shifter 100.

In addition, the current limiting resistor R3 is configured to decrease the quantity of the current sunk by the transistor T101 in the short-circuit condition, so as to decrease a power consumption of the transistors T8, T101 in the short-circuit condition.

It should be noted that, in some embodiment of the present invention, the transistor T101 and the current limiting resistors R2, R3 can be dismissed. In addition, all the values of the voltage levels describe above are merely descriptive examples, in practice, all the values of the voltage levels can be varied on the basis of actual requirement, with the values thereof not being limited to the embodiment described above. Moreover, the voltage levels (e.g., VGH, VGL, VMP, VDD, VSS) describe above are merely used to facilitate the description to follow by the reader, all the voltage levels can be varied on the basis of actual requirement, with the voltage levels thereof not being limited to the embodiment described above.

In the following paragraph more specific details about the second output stage 130a would be provided. However, the present invention is not limited to the details disclosed below.

Figure 7:
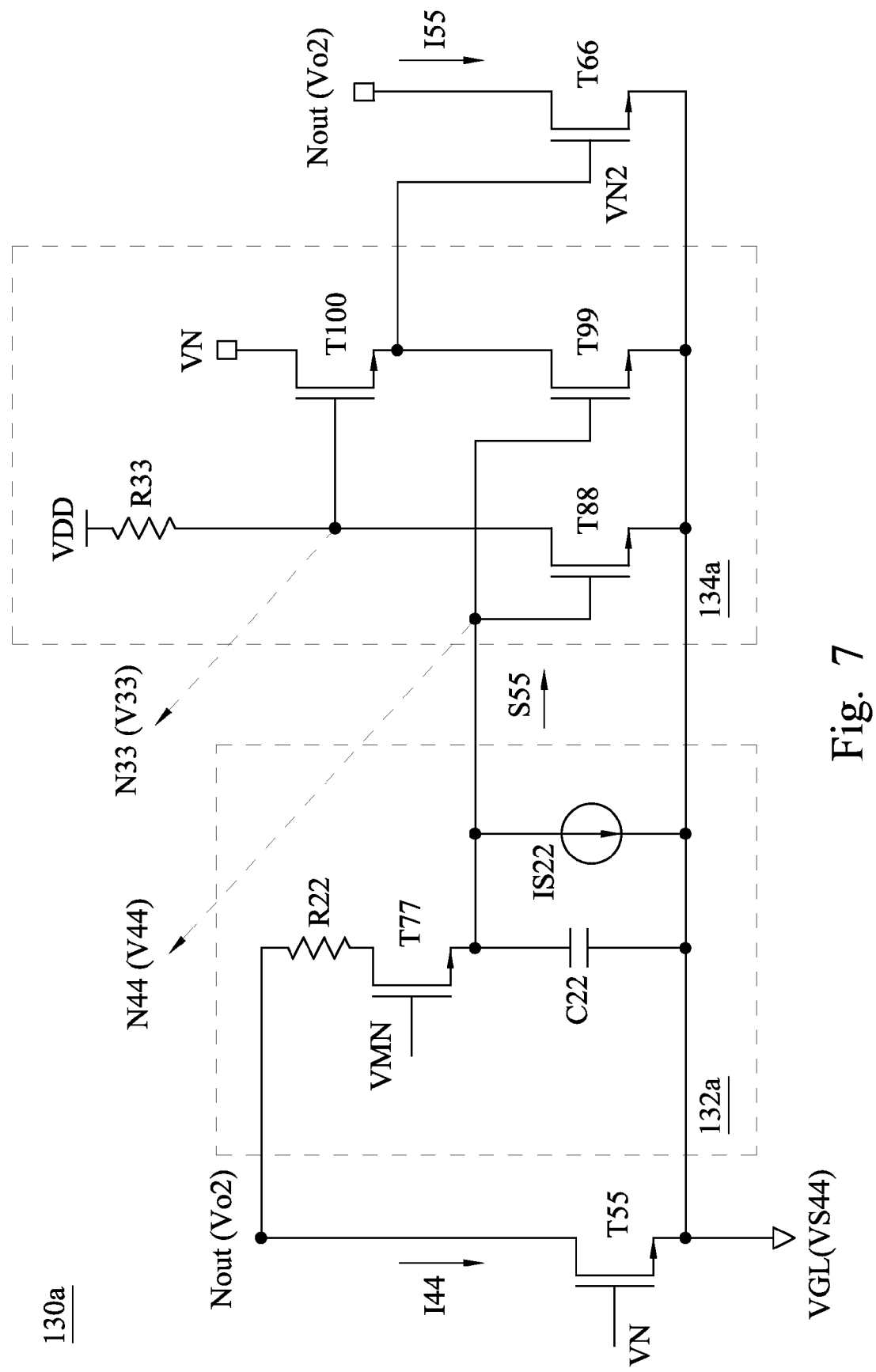
FIG. 7 is a schematic diagram of another type of second output stage in accordance with one embodiment of the present disclosure.

FIG. 7 is a schematic diagram of another type of second output stage 130a in accordance with one embodiment of the present disclosure. In this embodiment, the second output stage 130a includes a power transistor T55, a power transistor T66, a detecting module 132a, and a protecting module 134a. In this embodiment, each the power transistors T55, T66 has a first end, a second end, and a gate end. The first end of the power transistor T55 is electrically connected to a voltage source VS44 with a voltage level VGL (e.g., −20V). The second end of the power transistor T55 is electrically connected to the output node Nout. The gate end of the power transistor T55 is configured to receive the signal VN. The first end of the power transistor T66 is electrically connected to the voltage source VS44 with the voltage level VGL. The second end of the power transistor T66 is electrically connected to the output node Nout. The gate end of the power transistor T66 is configured to receive a signal VN2. The detecting module 132a is electrically connected between the output node Nout and the protecting module 134a. The protecting module 134a is electrically connected between the detecting module 132a and the gate end of the power transistor T66.

In this embodiment, the power transistors T55, T66 can be implemented by n-type power MOSFETs. Both the detecting module 132a and the protecting module 134a can be implemented by electronic circuits.

In this embodiment, the power transistor T55 is configured to be turned on according to the signal VN to sink a current I44 from the output node Nout. The power transistor T66 is configured to be turned on according to the signal VN2 to sink a current I55 from the output node Nout. The detecting module 132a is configured to detect the output voltage Vo2 on the output node Nout to determine whether a short-circuit condition occurs, and to provide a detecting signal S55 in the short-circuit condition. The protecting module 134a is configured to receive the detecting signal S55 and the signal VN, to provide the signal VN to the gate end of the power transistor T66 to serve as the signal VN2 in a normal condition, and to turn off the power transistor T66 according to the detecting signal S55 in the short-circuit condition.

In such a configuration, the voltage level shifter 100 with a short-protection function can be implemented. By operatively deactivated the power transistor T66, the current (e.g., current I44) generated by the second output stage 130a in the short-circuit condition can be decreased from the current (e.g., current I44+current I55) generated by the second output stage 130a in the normal condition, so as to prevent damages of the voltage level shifter 100 and the digital circuits coupled to the voltage level shifter 100.

In the following paragraphs, more specific details about the second output stage 130a would be provided. However, the present invention is not limited to the details disclosed below.

In one embodiment, the detecting module 132a includes a delay capacitor C22, a clamp transistor T77 (e.g., an n-type transistor), a current source IS22, and a current limiting resistor R22. The first end of the clamp transistor T77 is electrically connected to a node N44. The second end of the clamp transistor T77 is electrically connected to the output node Nout through the current limiting resistor R22. The gate end of the clamp transistor T77 is configured to receive a voltage level VMN (e.g., −15V). The current limiting resistor R22 is electrically connected between the second end of the clamp transistor T77 and the output node Nout. The delay capacitor C22 is electrically connected between the voltage source VS44 and the node N44. The current source IS22 is electrically connected between the voltage source VS44 and the node N44.

In this embodiment, a voltage V44 on the node N44 is charged/discharged through the clamp transistor T77 and the current source IS22, to operatively provide the detecting signal S55 to the protection module 134a.

For example, in the normal condition, the voltage Vo2 on the output node Nout has the voltage level VGL. According to the voltage level VGL on the output node Nout, there is no current flowing through the clamp transistor T77. In this period, the delay capacitor C22 is discharged by the current source IS22, such that the voltage V44 on the node N44 is discharged to the voltage level VGL, and hence, the detecting signal S55 does not be outputted. While in the short-circuit condition, the voltage Vo2 on the output node Nout is shorted to a high voltage level, such as a voltage level VGH (e.g., 40V). According to the high voltage level on the output node Nout, the voltage V44 on the node N44 is charged to a clamp voltage level corresponding to the voltage level VMN by a current flowing through the clamp transistor T77 (supposed that the clamp transistor T77 is turned on according to the voltage level VMN). At this time, the clamp voltage level on the node N44 is served as the detecting signal S55.

In such a way, the detecting module 132a can provide the detecting signal S55 to the protection module 134a in the short-circuit condition.

It should be noted that, the clamp voltage level can be a voltage level around the voltage level VGL. For example, if the voltage level VMN provided to the clamp transistor T77 is −15V, and the threshold voltage of the clamp transistor T77 is 0.7V, then the clamp voltage level is −15V−0.7V=−15.7V. In such a configuration, the transistors coupled to the node N44 (e.g., T88, T99) can be manufactured with withstanding voltages between the gate ends and the first ends (e.g., the source ends) merely higher than a difference between the clamp voltage level (−15.7V) and the voltage level VGL (−20V), such that the size and the cost of the transistors coupled to the node N44 (e.g., T88, T99) can be minimized.

In another aspect, the clamp voltage level should be configured to be smaller than or equal to a sum of any one of the withstanding voltages of the transistor T88 and the transistor T99 and the voltage level VGL.

In addition, in this embodiment, the current limiting resistor R22 is configured to minimize the quantity of the current flowing through the clamp transistor T77 in the short-circuit condition, so as to decrease a power consumption of the detecting module 130a (e.g., the clamp transistor T77) in the short-circuit condition. It should be noted that, in some embodiment of the present invention, the current limiting resistor R22 can be dismissed.

Moreover, the delay capacitor C22 is configured to delay a time point that the node N44 is charged to the clamp voltage level with a delay time period. That is, there is the delay time period between a time point when the short-circuit condition occurs and the time point when the node N44 being charged to the clamp voltage level caused by the delay capacitor C22. Such a delay time period is longer than or equal to a discharging time of the loading capacitor Co electrically connected to the output node Nout, so as to avoid a start condition of the second output stage 130a being judged as the short-circuit condition. The details of the start condition of the first output stage 130a and the delay time period can be referred to the paragraphs above (e.g., corresponding to the FIG. 8b), a description in this regard will not be repeated herein.

In this embodiment, the protection module 134a includes a first charge/discharge unit including transistors T88; a second charge/discharge unit including transistors T99, T100; and a current limiting resistor R33. In this embodiment, the transistors T88, T99, T100 are n-type transistors. The first end of the transistor T88 is electrically connected to the voltage source VS44. The second end of the transistor T88 is electrically connected to a node N33. The gate end of the transistor T88 is electrically connected to the node N44. The current limiting resistor R33 is electrically connected between the transistor T88 and the voltage source with a voltage level VDD. The first end of the transistor T99 is electrically connected to the voltage source VS44. The second end of the transistor T99 is electrically connected to the gate end of the power transistor T66. The gate end of the transistor T99 is electrically connected to the node N44. The first end of the transistor T100 is electrically connected to the gate end of the power transistor T66. The second end of the transistor T100 is electrically connected to the gate end of the power transistor T55. The gate end of the transistor T100 is electrically connected to the node N33.

In this embodiment, the first charge/discharge unit (i.e., T88) is configured to discharge the node N33 to the voltage level VGL according to the detecting signal S55 (i.e., the clamp voltage level on the node N44) in the short-circuit condition, and to make the node N3 be charge to the voltage level VDD according to the voltage level VGL on the node N44 in the normal condition. The second charge/discharge unit (i.e., T99, T100) is configured to discharge the gate end of the power transistor T66 to the voltage level VGL according to the clamp voltage level on the node N44 and the voltage level VGL on the node N33 in the short-circuit condition, and to charge the gate end of power transistor T66 to a driving voltage level of the signal VN according to the voltage level VGL on the node N44 and the voltage level VDD on the node N33 in the normal condition.

For example, in the normal condition that the voltage V44 on the node N44 has the voltage level VGL, the transistor T88 is turned off according to the voltage level VGL on the node N4, such that the node N33 is charged to the voltage level VDD. At this time, the transistor T99 is turned off according to the voltage level VGL on the node N44, and the transistor T100 is turned on according to the voltage level VDD on the node N33, such that the signal VN is provided to the gate end of the power transistor T66 to be served as the signal VN2. While in the short-circuit condition that the voltage V44 on the node N44 has the clamp voltage level, the transistor T88 is turned on according to the clamp voltage level on the node N44, to discharge the node N33 to the voltage level VGL. At this time, the transistor T100 is turned off according to the voltage level VGL on the node N33, and the transistor T99 is turned on according to the clamp voltage level on the node N44, such that the voltage level VGL is provided to the gate end of the power transistor T66, so as to turn off the power transistor T66.

In another aspect of view, the first charge/discharge unit (i.e., T8) can be a first current comparator, configured to charge and discharge the node N33 according to a current flowing through the transistor T88 and a current flowing through the current limiting resistor R33. The second charge/discharge unit (i.e., T99, T100) can be a second current comparator, configured to charge and discharge the gate end of the transistor T66 according to a current flowing through the transistor T99 and a current flowing through the transistor T100.

For example, in the normal condition that the voltage V44 on the node N44 has the voltage level VGL, the transistor T88 is turned off according to the voltage level VGL on the node N54, the current flowing through the transistor T88, which is zero, is smaller than the current flowing through the current limiting resistor R33, such that the charges are accumulated on the node N33, and the node N33 is charged to the voltage level VDD by the current flowing through the current limiting resistor R33. At this time, the transistor T99 is turned off according to the voltage level VGL on the node N44, and the transistor T100 is turned on according to the voltage level VDD on the node N33, the current flowing through the transistor T99, which is zero, is smaller than the current flowing through the transistor T100, such that the charges are accumulated on the gate end of the transistor T66, and the gate end of the transistor T66 is charged to the driving voltage level of the signal VN by the current flowing through the transistor T100 to provide the signal VN to the gate end of the transistor T66. While in the short-circuit condition that the voltage V44 on the node N44 has the clamp voltage level, the transistor T88 is turned on according to the clamp voltage level on the node N44, the current flowing through the transistor T88 is greater than the current flowing through the current limiting resistor R33, such that the charges on the node N33 are released, and the node N33 is accordingly discharged to the voltage level VGL by the current flowing through the transistor T88. At this time, the transistor T100 is turned off according to the voltage level VGL on the node N33, and the transistor T99 is turned on according to the clamp voltage level on the node N44, the current flowing through the transistor T99 is greater than the current flowing through the transistor T100, which is zero, such that the charges on the gate end of the power transistor T66 are released, and the gate end of the power transistor T66 is accordingly discharged to the voltage level VGL by the current flowing through the transistor T99. At this time, the power transistor T66 is turned off.

In such a configuration, the current (e.g., current I44) generated by the second output stage 130a in the short-circuit condition can be decreased from the current (e.g., current I44+current I55) generated by the second output stage 130a in the normal condition, so as to prevent damages of the voltage level shifter 100 and the digital circuits coupled to the voltage level shifter 100.

In addition, the current limiting resistor R33 is configured to decrease the quantity of the current provided by the voltage source of the voltage level VDD and flowing through the transistor T88 in the short-circuit condition, so as to decrease a power consumption of the transistor T88 in the short-circuit condition.

It should be noted that, in some embodiment of the present invention, the current limiting resistors R22, R33 can be dismissed. In addition, all the values of the voltage levels describe above are merely descriptive examples, in practice, all the values of the voltage levels can be varied on the basis of actual requirement, with the values thereof not being limited to the embodiment described above. Moreover, the voltage levels (e.g., VGH, VGL, VMN, VDD) describe above are merely used to facilitate the description to follow by the reader, all the voltage levels can be varied on the basis of actual requirement, with the voltage levels thereof not being limited to the embodiment described above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An output stage with short-circuit protection comprising:
   a power transistor comprising a first end, a second end, and a gate end, wherein the first end of the power transistor is electrically connected to a voltage source with a first reference voltage level, the second end of the power transistor is electrically connected to an output node, and the gate end of the power transistor is configured to receive a driving signal;
   a detecting module configured to detect an output voltage on the output node to determine whether a short-circuit condition occurs, and to provide a detecting signal according to the output voltage on the output node in the short-circuit condition, wherein the detecting module comprises:
   a current source configured to generate a first comparing current flowing through an operative node; and
   a current mirror configured to generate a second comparing current flowing through the operative node according to the output voltage on the output node, wherein the operative node is charged/discharged to an operative voltage level to serve as the detecting signal in a case that the first comparing current is greater than the second comparing current;
   a disable module configured to provide a disable signal according to the detecting signal in the short-circuit condition, and to operatively stop the disable signal in each cycle period of a clock signal; and
   a driving module configured to determine whether to generate the driving signal according to the disable signal and the clock signal.

2. The output stage with short-circuit protection as claimed in claim 1, wherein the current mirror comprises:
   a first transistor, wherein a first end of the first transistor is electrically connected to a gate end of the first transistor; and
   a second transistor, wherein a first end of the second transistor is electrically connected to the operative node, a second end of the second transistor is electrically connected to a second end of the first transistor, and a gate end of the second transistor is electrically connected to the gate end of the first transistor.

3. The output stage with short-circuit protection as claimed in claim 2, wherein the detecting module further comprises:
   a clamp transistor electrically connected between the output node and the first end of the first transistor, wherein the clamp transistor is configured to clamp a gate voltage on the gate end of the first transistor between a clamp voltage level and a second reference voltage level.

4. The output stage with short-circuit protection as claimed in claim 3, wherein each of the first transistor and the second transistor has a withstanding voltage, and a voltage difference between the clamp voltage and the second reference voltage level is smaller than any one of the withstanding voltages of the first transistor and the second transistor.

5. The output stage with short-circuit protection as claimed in claim 2, wherein the detecting module further comprises:
   a current limiting resistor electrically connected between the second end of the first transistor and a voltage source with a second reference voltage level, and configured to decrease a power consumption of the current mirror in the normal condition.

6. The output stage with short-circuit protection as claimed in claim 1, wherein the disable module comprises:
   a delay unit configured to operatively delay the detecting signal to generate the disable signal in the short-circuit condition.

7. The output stage with short-circuit protection as claimed in claim 6, wherein the disable signal lags behind the detecting signal a delay time period, and the delay time period is longer than or equal to a charging/discharging time of a loading capacitor electrically connected to the output node.

8. The output stage with short-circuit protection as claimed in claim 6, wherein the disable module comprises:
   a latch configured to keep the disable signal to be provided to the driving module, and to operatively clear the kept disable signal in each cycle period of the clock signal.

9. The output stage with short-circuit protection as claimed in claim 5, wherein the driving module comprises:
   a logic unit configured to receive the clock signal and the disable signal, and to provide a control signal according to the clock signal and the disable signal; and a pre-driver configured to receive the control signal and provide the driving signal to the power transistor according to the control signal.

10. An output stage with short-circuit protection comprising:
- a first power transistor comprising a first end, a second end, and a gate end, wherein the first end of the first power transistor is electrically connected to a voltage source with a first reference voltage level, the second end of the first power transistor is electrically connected to an output node, and the gate end of the first power transistor is configured to receive a first driving signal;
- a second power transistor comprising a first end, a second end, and a gate end, wherein the first end of the second power transistor is electrically connected to the voltage source with the first reference voltage level, the second end of the second power transistor is electrically connected to the output node, and the gate end of the second power transistor is configured to receive a second driving signal;
- a detecting module configured to detect an output voltage on the output node to determine whether a short-circuit condition occurs, and to provide a detecting signal in the short-circuit condition; and
- a protecting module configured to provide the first driving signal to the gate end of the second power transistor to serve as the second driving signal in a normal condition, and to turn off the second power transistor according to the detecting signal in the short-circuit condition.

11. The output stage with short-circuit protection as claimed in claim 10, wherein a first current generated by the output stage flowing through the output node in the normal condition is larger than a second current generated by the output stage flowing through the output node in the short-circuit condition.

12. The output stage with short-circuit protection as claimed in claim 10, wherein the detecting module comprises:
- a clamp transistor electrically connected between an operative node and the output node, configured to clamp an operative voltage on the operative node between the first reference voltage level and a clamp voltage level, wherein in the short-circuit condition, the operative node is discharged/charged to the clamp voltage level through the clamp transistor according to the output voltage on the output node, and the clamp voltage level on the operative node is served as the detecting signal.

13. The output stage with short-circuit protection as claimed in claim 12, wherein the detecting module further comprises:
- a delay capacitor; and
- a current source configured to charge/discharge the delay capacitor in the normal condition to make the operative node be charged/discharged to the first reference voltage level.

14. The output stage with short-circuit protection as claimed in claim 13, wherein the delay capacitor is configured to delay a time point that the operative node is discharged/charged to the clamp voltage level with a delay time period, wherein the delay time period between the short-circuit condition occurs and the operative node being charged/discharged to the clamp voltage level is longer than or equal to a charging/discharging time of a loading capacitor electrically connected to the output node.

15. The output stage with short-circuit protection as claimed in claim 12, wherein the protecting module comprises:
- a first protecting transistor configured to be turned on according to a second reference voltage level on a control node in the normal condition to provide the first driving signal to the gate end of the second power transistor to serve as the second driving signal, and configured to be turned off according to the first reference voltage level on the control node in the short-circuit condition.

16. The output stage with short-circuit protection as claimed in claim 15, wherein the protecting module further comprises:
- a second protecting transistor configured to be turned off according to the first reference voltage level on the operative node in the normal condition, and configured to be turned on according to the clamp voltage level on the operative node in the short-circuit condition to provide the first reference voltage level to the control node.

17. The output stage with short-circuit protection as claimed in claim 16, wherein the protecting module further comprises:
- a third protecting transistor configured to be turned off according to the first reference voltage level on the operative node in the normal condition, and configured to be turned on according to the clamp voltage level on the operative node in the short-circuit condition to provide the first reference voltage level to the gate end of the second power transistor, so as to turn off the second power transistor.

18. The output stage with short-circuit protection as claimed in claim 17, wherein each of the second protecting transistor and the third protecting transistor has a withstanding voltage, and any one of the withstanding voltages of the second protecting transistor and the third protecting transistor is larger than a voltage difference between the first voltage level and the clamp voltage level.

19. The output stage with short-circuit protection as claimed in claim 12, wherein the protecting module comprises:
- a first charge/discharge unit configured to charge/discharge a control node to the first reference voltage level according to the clamp voltage level on the operative node, and to discharge/charge the control node to a second reference voltage level according to the first reference voltage level on the operative node; and
- a second charge/discharge unit configured to charge/discharge the gate end of the second power transistor to the first reference voltage level according to the clamp voltage level on the operative node and the first reference voltage level on the control node, and to discharge/charge the gate end of the second power transistor to a driving voltage level of the first driving signal according to the clamp voltage level on the operative node and a second reference voltage level on the control node.

* * * * *